United States Patent
O'Dell et al.

(10) Patent No.: US 7,898,163 B2
(45) Date of Patent: *Mar. 1, 2011

(54) (PARTIALLY) CONJUGATED POLYMER, PROCESS FOR ITS PREPARATION AND USE IN ELECTROLUMINESCENT DEVICES

(75) Inventors: Richard O'Dell, Taufkirchen (DE); Carl Towns, Stansted (GB); Mary McKiernan, Cambridgeshire (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 953 days.

This patent is subject to a terminal disclaimer.

(21) Appl. No.: 11/585,753

(22) Filed: Oct. 24, 2006

(65) Prior Publication Data

US 2007/0034832 A1 Feb. 15, 2007

Related U.S. Application Data

(63) Continuation of application No. 10/468,719, filed as application No. PCT/GB02/00749 on Feb. 20, 2002, now Pat. No. 7,125,952.

(60) Provisional application No. 60/285,297, filed on Apr. 20, 2001.

(30) Foreign Application Priority Data

Feb. 21, 2001 (GB) ................... 0104284.5

(51) Int. Cl.
H01J 1/62 (2006.01)
(52) U.S. Cl. ............. 313/483; 252/301.16; 252/301.35; 252/700; 313/504; 428/917; 528/394; 528/397
(58) Field of Classification Search ........................ None
See application file for complete search history.

(56) References Cited

U.S. PATENT DOCUMENTS

| | | | | |
|---|---|---|---|---|
| 4,539,507 | A | 9/1985 | VanSlyke et al. ............. | 313/504 |
| 5,053,566 | A | 10/1991 | Botta et al. .................. | 570/208 |
| 5,621,131 | A | 4/1997 | Kreuder et al. ............... | 558/46 |
| 5,728,480 | A | 3/1998 | Stern et al. .................. | 428/690 |
| 5,766,515 | A | 6/1998 | Jonas et al. .................. | 252/500 |
| 5,777,070 | A | 7/1998 | Inbasekaran et al. ........ | 528/394 |
| 6,083,635 | A | 7/2000 | Jonas et al. .................. | 428/690 |
| 6,541,602 | B1 | 4/2003 | Spreitzer et al. ............. | 528/394 |
| 6,653,438 | B1 * | 11/2003 | Spreitzer et al. ............. | 528/394 |

FOREIGN PATENT DOCUMENTS

| | | |
|---|---|---|
| EP | 686 662 A2 | 12/1995 |
| EP | 686 662 A3 | 12/1995 |
| EP | 707 020 A2 | 4/1996 |
| EP | 707 020 A3 | 4/1996 |
| JP | 11-246660 | 9/1999 |
| WO | WO 89/07617 | 8/1989 |
| WO | WO 90/13148 | 11/1990 |
| WO | WO 98/41065 | 9/1998 |
| WO | WO 99/54385 | 10/1999 |
| WO | WO 00/22026 | * 4/2000 |
| WO | WO 00/22027 | 4/2000 |
| WO | WO 00/53656 | 9/2000 |
| WO | WO 00/55927 | 9/2000 |

OTHER PUBLICATIONS

"Synthesis and Characterization of New Copolymers based on Fluorenylidene-linked Conjugated Oligo(p-phenylene)s" authored by Raber et al., and published in Macromol. Chem. Phys., 2000, 201, 2257-2266.*
Bushby et al., "High-Spin Organic Polymers," *Chem. Commun.*, 659-660 (1996).
Bushby et al., "p-Doped High Spin Polymers," *J. Mater. Chem.*, 7(12): 2343-2354 (1997).
Ghera et al., "Reductive Transformations with Trimethylsilyl Chloride-Sodium Iodide. A New Synthesis of 4H-1,3-Oxazines," *Tetrahedron Letters*, 30(35): 4741-4744 (1989).
Goodson et al., "Application of 'Transfer-Free' Suzuki Coupling Protocols Toward the Synthesis of 'Unambiguously Linear' Poly(p-phenylenes)," *Macromolecules*, 31: 2047-2056 (1998).
Grem et al., "Electroluminescence of "Wide-Bandgap" Chemically Tunable Cyclic Conjugated Polymers," *Synthetic Metals*, 55-57:4105-4110 (1993).

(Continued)

*Primary Examiner*—Marc S Zimmer
(74) *Attorney, Agent, or Firm*—Marshall, Gerstein & Borun LLP

(57) ABSTRACT

A polymer for use in an optical device comprising one or more regions, where each region comprises (i) a first structural unit having general formula I:

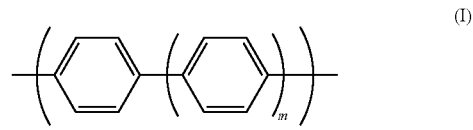

(I)

where m=1 or 2 and which contains at least one substituent selected from the group consisting of alkyl, alkoxy, aryl, aryloxy, heteroaryl, and heteroaryloxy groups, each of which may be further substituted; and (ii) a second structural unit Ar selected from the group consisting of heteroaryl, triarylamine and 2,7-fluorenyl; such that where m=1 each region comprises a unit having general formula II:

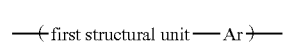

(II)

wherein, the substituent has a molecular weight of less than 300.

12 Claims, 1 Drawing Sheet

OTHER PUBLICATIONS

Hensel et al., "A Biphenyl Construction Kit for Modular Chemistry," *Liebigs Ann./Recueil*, pp. 303-309 (1997).

Hu et al., "Synthesis of Rigid Chiral Polymer Catalysts for the Asymmetric Diels-Alder Reaction," *Polymer Preprints* 41(1):16-17 (2000).

Karakaya et al., "Toward Dendrimers with Cylindrical Shape in Solution," *J. Am. Chem. Soc.*, 119:3296-3301 (1997).

Kreyenschmidt et al., "Thermally Stable Blue-Light-Emitting Copolymers of Poly(alkylfluorene)," *Macromolecules*, 31: 1099-1103 (1998).

Krigbaum et al., "Poly(dimethyl Biphenylene)," *Journal of Polymer Science: Polymer Chemistry Edition*, vol. 16:3151-3156 (1978).

Solomin et al., "Palladium-Catalyzed Synthesis of Poly(*p*-phenyleneethynylene)," *Macromol. Chem. Phys.*, 195:303-314 (1994).

Thelakkat et al., "Synthesis and Properties of New Hole Transport Materials for Organic Light Emitting Devices," *SPIE* vol. 3148:306-312 (Dec. 1997).

International Search Report in PCT/GB02/00749 dated Jul. 8, 2002.

International Preliminary Examination Report in PCT/GB02/00749 dated Apr. 1, 2003.

Search Report in GB 0104284.5 dated Aug. 21, 2001.

\* cited by examiner

(PARTIALLY) CONJUGATED POLYMER, PROCESS FOR ITS PREPARATION AND USE IN ELECTROLUMINESCENT DEVICES

CROSS-REFERENCE TO RELATED APPLICATIONS

This is a continuation of U.S. Ser. No. 10/468,719, which is the U.S. national phase of International Application No. PCT/GB02/00749 filed Feb. 20, 2002, and which claims the benefit of the filing date of U.S. Provisional Application Ser. No. 60/285,297 filed Apr. 20, 2001, the entire respective disclosures of which are incorporated herein by reference.

The present invention relates to a novel polymer, especially for use in an optical device such as an optical device comprising an electroluminescent device.

Electroluminescent devices are structures which emit light when subject to an applied electric field. In its simplest form, an electroluminescent device comprises a light-emissive layer located between two electrodes. The cathode electrode injects negative charge carriers (electrons)s and the anode electrode injects positive charge carriers (holes) into the light-emissive layer. Light emission occurs when the electrons and holes combine in the light-emissive layer to generate excitons which decay to give photons. As a practical aspect, one of the electrode is typically transparent to allow the photons to escape the device. The light-emissive layer should be made from a light-emissive material which may be laid down as a film without substantially affecting the luminescent characteristics of the material and which is stable at the operation temperature of the device.

Organic electroluminescent devices which use an organic material as the light-emissive material are known in this art. Among organic materials, simple aromatic molecules such as anthracene, perylene and coronene are known to show electroluminescence. U.S. Pat. No. 4,539,507 discloses the use of small molecule organic materials as the light-emissive material. PCT/WO90/13148 discloses an electroluminescent device comprising a semiconductor layer comprising a polymer film of the light-emissive layer which comprises at least one conjugated polymer. In this case, the polymer film comprises a poly(para-phenylene vinylene) (PPV) film.

The colour of the light generated by the light-emissive material is determined by the optical gap or bandgap of the organic light-emissive material, that is to say the difference in energy levels between the "highest occupied molecular orbital" (HOMO) and the "lowest unoccupied molecular orbital" (LUMO) levels. Effectively, the bandgap is the energy difference between the valance and conduction bands. These levels can be estimated by photoemission measurements and measurements of the electrochemical potential for oxidation and reduction. The level of these energies is effected by numerous factors. Accordingly, the use of such values is indicative rather than quantitative.

It is known to use a semiconductive conjugated copolymer as the light-emissive layer in an electroluminescent device. The semiconductive conjugated copolymer comprises at least two chemically different monomer units which, when existing in their individual homopolymer forms, typically have different semiconductor bandgaps. The proportion of the different monomer units in the copolymer can be selected to control the semiconductor bandgap of the copolymer so as to control the optical properties of the copolymer. To some degree, the extent of conjugation of the copolymer can be said to effect the n-n* bandgap of the copolymer. Increasing the extent of conjugation has the effect of decreasing the bandgap up to the point of bandgap conversion. Therefore, selection of the appropriate reaction components may be used to modulate the bandgap. This property may be exploited so that the semiconductor bandgap is modulated to control the wavelength (i.e. colour) of radiation emitted during luminescence. This gives the very desirable feature of controlling the colour of light output from the polymer. This property is useful particularly in the construction of electroluminescent devices.

EP 0686662 discloses a device for emitting green light. The anode is a layer of transparent indium-tin oxide. The cathode is a LiAl layer. Between the electrodes is a light-emissive layer of PPV. The device comprises also a hole transport layer of polyethylene dioxythiophene which provides an intermediate energy level which aids the holes injected from the anode to reach the HOMO level in the PPV.

One class of polymers used as the active material in electroluminescent devices are 2,7-polyfluorenes as disclosed in, for example, WO 99/54385 and WO 00/55927 which disclose 2,7 linked 9,9-dialkylfluorenes and EP 0707020 which discloses spirofluorenes. 2,7 linked fluorene units with 2 reactive end groups are advantageous in that they can be prepared with dihalide ordiboronic acid or ester reactive end groups. As such, they are amenable for use as monomers in Suzuki polymerisation which enables control over the regioregularity of copolymers. These facts enable the use of 2,7 linked fluorene repeat units as linking units for the incorporation of hole transporting, electron transporting and/or emissive repeat units into a conjugated polymer chain. Separately and in addition, a chain of polyfluorene repeat units can provide electron transporting functionality.

SPIE, Volume 3148 "Synthesis and Properties of New Hole Transport Materials for Organic Light-Emitting Devices" is concerned, in part, with polymeric triphenyldiamines as hole transport materials for electroluminescent displays. Scheme 3 on page 310 illustrates a polymer where a disubstituted biphenyl repeat unit can be defined. In this polymer, the biphenyl repeat unit is linked directly to two nitrogen atoms in the polymer backbone. The nitrogen atoms act as nodes which prevent conjugation with the biphenyl repeat unit.

Liebigs Ann./Recueil 1997 pages 303-309 "A Biphenyl Construction Kit for Modular Chemistry" discloses the synthesis of a number of biphenyls. It is stated that the biphenyls constitute a construction kit for modular chemistry using the Suzuki 'Cross-Coupling protocol. This document envisages only homopolymers containing the biphenyl repeat unit. This document is not concerned specifically with the field of electroluminescent devices.

Macromol. Chem. Phys. 195, pages 303-314 (1994) "Palladium-Catalyzed Synthesis of poly(p-phenylene ethynylene)s is concerned with poly(p-phenylene ethynylene)s which show blue fluorescence. An example of such a polymer is shown by reference numeral 5 on page 304. Any biphenyl repeat unit that can be defined in this polymer will be directly linked only to two C≡C.

WO 89/07617 is concerned with high-performance polymers having a rigid-rod backbone. This document is not concerned with the field of electroluminescent devices. Substituents on the rigid-rod polymer are limited to so-called "solubilising organic groups" which have a molecular weight of at least 300.

U.S. Pat. No. 5,053,566 is concerned with oligophenyls. Each phenyl group contains only one alkyl or alkoxy substituent. This document is not concerned with the field of electroluminescent devices.

Journal of Polymer Science: Polymer Chemistry Addition, Vol. 16, 3151-3156 (1978) is concerned with rod like polymers that are expected to form a nematic phase. This document is not concerned with the field of electroluminescence. Poly(dimethyl biphenylene) is prepared.

J. Mater. Chem., 1997, 7(12), 2343-2354 is concerned with high spin polymers that have been created from p-doping of networked polymers. This document is not concerned at all with the field of electroluminescence.

Polym. PREPR. (Am. Chem. Soc., Div. Polym. Chem.), 2000, 41(1) is concerned with chiral catalysts. This document is not concerned at all with the field of electroluminescence.

J. Am. Chem. Soc. 1997, 119(14), 3296-3301, Macromol. Symp. (1995), 98(35th IUPAC International Symposium on Macromolecules, 1995), 475-482 and Polymer (1994), 35(21), 4496-4501 disclose copolymers comprising a first repeat unit of a 2,2'-disubstituted biphenyl and a second repeat unit of a substituted phenyl. These documents are not concerned with the field of polymer electroluminescence.

Macromolecules 1998, 31, 2047-2056 is concerned specifically with the problem of trying to make an 'unambiguously linear' poly(p-phenylene) by Suzuki polymerisation. Acopolymer comprising a first repeat unit of a 2,2'-dialkoxy biphenyl and a second repeat unit of a 2,2'-trifluoromethyl biphenyl is disclosed. This document does not disclose any other copolymers of biphenyl or terphenyl repeat units.

Much work is being done in the field of the electroluminescent devices to develop new polymers, especially polymers that are efficient hole or electron transport materials. Such polymers are needed as alternatives to present hole or electron transport polymers. Preferably, the alternatives will be superior in performance when used in an electroluminescent device. Desirable polymers would have good optical device characteristics such as solubility and processability of the polymer and the lifetime of the polymer when used in a device.

In view of the above, it is an aim of the present invention to provide a new polymer. It is a further aim of the present invention to provide uses of the polymer. It is still a further aim of the present invention to provide monomeric units that can be used to prepare the polymer. Finally, it is an aim of the present invention to provide a process for preparing the polymer, particularly using the monomeric units provided by this invention.

In a first aspect, the present invention provides a polymer for use in an optical device comprising one or more regions, where the or each region comprises (i) a first structural unit having general formula I:

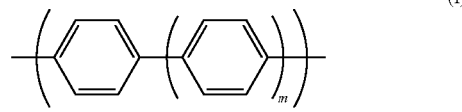

(I)

where m=1 or 2 and which contains at least one substituent and the at least one substituent is selected from the group consisting of an alkyl, alkoxy, aryl, aryloxy, heteroaryl and heteroaryloxy groups, each of which may be further substituted; and (ii) a second structural unit Ar selected from the group consisting of heteroaryl, triarylamine and/or 2,7-fluorenyl; such that where m=1 the or each region comprises a unit having general formula II:

(II)

wherein, the at least one substituent has a molecular weight of less than 300.

By "heteroaryl" is meant an optionally substituted aryl moiety comprising at least one heteroaromatic unit.

By "triarylamine" is meant an optionally substituted unit comprising at least three aryl groups and at least one nitrogen atom, the at least one nitrogen atom being directly attached to three aryl groups and the unit being linked to adjacent structural units through two of the at least three aryl groups.

By "2,7-fluorenyl" is meant an optionally substituted unit comprising a 2,7-linked fluorene.

In the first aspect of the present invention, the at least one substituent is an alkyl, alkoxy, aryl, aryloxy, heteroaryl or heteroaryloxy group that is directly linked to the first structural unit. That is to say, it is not linked to the first structural unit via another group that is not an alkyl, alkoxy, aryl, aryloxy, heteroaryl or heteroaryloxy group.

The applicants have found that the present polymer can act as an efficient hole and/or electron (positive and/or negative charge carrier) transport material or as an emissive material wherein the structural unit of formula (I) is used as a linking group to link one or more further structural units or chains of structural units in the polymer chain where each structural unit or chain of structural units independently forms a region along the polymer backbone that is capable of transporting holes, transporting electrons or emitting light when the polymer is used in an electroluminescent device as described below.

The use of linking groups in a polymer backbone can be useful for a number of reasons. They are of use especially when the polymer is prepared by Suzuki polymerisation. This is because the linking group can be used to control the position of structural units in the polymer chain. In the present polymer, the second structural unit Ar, either alone or in conjugation with one or more other structural units, will form a region along the polymer backbone that is capable of transporting holes, transporting electrons or emitting light when the polymer is used in an electroluminescent device as described below.

In addition to their use as linking groups, structural units of formula (I) themselves, either alone or in conjugation with one or more other structural units, such as one or more structural units of formula (I) and/or one or more second structural units Ar, may form a region along the polymer backbone that is capable of transporting electrons or emitting light.

It has been found that many of these polymers are particularly advantageous because structural units of formula (I) generally are able to twist out of the plane of the polymer backbone.

This twist can result in a reduced tendency to stack and form crystals by comparison with analogous polymers comprising fluorene repeat units. In addition, this twist can result in a decrease in conjugation of the polymer because a non-planar molecule is not able to conjugate as effectively as a planar molecule. This in turn results in an increase in the HOMO-LUMO gap.

The at least one substituent on the first structural unit has a molecular weight of less than 300. This has the advantage of improving the solubility of the polymer. Furthermore, such substituents can be used to tune the band gap of the polymer by electronic and steric effects. In order to optimise these effects further, it is preferred that each substituent on the first structural unit has a molecular weight of less than 300. More specifically, it is preferred that each substituent comprises less than 20 carbon atoms.

Conjugation is a key factor for consideration in the present invention. It will be appreciated that by virtue of at least the biphenyl or terphenyls repeat unit, the polymer must be at least partially conjugated. It may be substantially or even fully conjugated along the length of the polymer backbone. In the present invention, the first structural unit in the or each region should be conjugated directly with Ar. That is to say, the first structural unit should not be linked directly to Ar via a node which prevents electron transport along the length of the polymer backbone to or from the first structural unit.

Preferably, the present polymer is a substantially linear polymer.

Also preferably, the at least one substituent is selected from alkyl and alkoxy.

Also preferably, when m=2, the or each region comprises a unit having general formula II:

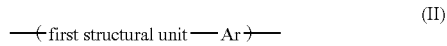
(II)

In a first embodiment of the first aspect of the present invention, the first structural unit has general formula III:

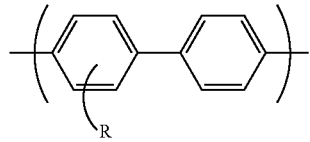
(III)

where R comprises a group, selected from the group consisting of a substituted or unsubstituted alkyl, alkoxy, aryl, aryloxy, heteroaryl and heteroaryloxy, particularly, alkyloxy, haloalkyl and haloalkoxy, namely perfluoroalkyl (preferably —$CF_3$) or perfluoroalkoxy.

In a second embodiment of the first aspect of the present invention, the first structural unit contains at least two substituents that may be located on the same phenyl group or on different phenyl groups. Preferably, in the second embodiment, the first structural unit has general formula IV:

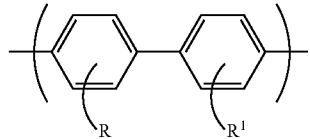
(IV)

where R and $R^1$ are the same or different and each comprises a group selected from the group consisting of a substituted or unsubstituted alkyl, alkoxy, aryl, aryloxy, heteroaryl and heteroaryloxy, particularly, alkyloxy, haloalkyl and haloalkoxy, namely perfluoroalkyl (preferably —$CF_3$) or perfluoroalkoxy.

Preferably, the first structural unit having general formula III, has a general formula V:

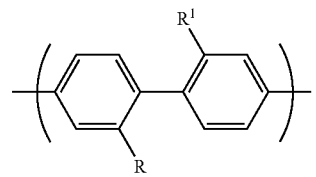
(V)

where R and $R^1$ are as defined above.

The position of R and $R^1$ on the first structural unit having general formula V is preferred because, where these repeat units are provided as monomeric units with reactive end groups, the monomeric units will polymerise to form the present polymer more readily when there are no substituent groups in the vicinity of the polymerisation sites. Substituent groups in the vicinity of the polymerisation sites could be expected to present a steric hindrance to polymerisation.

It is envisaged that various R groups in formula III and R and $R^1$ groups in formulae IV and V above will be useful for modulating the HOMO-LUMO gap of the polymer and also for controlling the extent of "twisting" out of plane of the polymer backbone as explained above. Substituted or unsubstituted alkyl and alkoxy groups are of current interest. In this regard, the present inventors have identified several R and $R^1$ groups of particular interest; these include methyl, hexyl, octyl, methoxy, hexyloxy and octyloxy.

For ease of manufacture or synthesis, generally R and $R^1$ will be the same although this is not essential.

In a third embodiment of the first aspect according to the present invention, the first structural unit has a general formula VI:

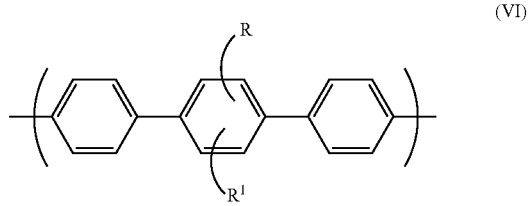
(VI)

which may be further substituted and where R and $R^1$ are the same or different and each comprise a group selected from the group consisting of halide, cyano, a substituted or unsubstituted alkyl, alkoxy, aryl, aryloxy, heteroaryl and heteroaryloxy, particularly, alkyloxy, haloalkyl and haloalkoxy, namely perfluoroalkyl (preferably —$CF_3$) or perfluoroalkoxy.

Preferred first structural units having general formula VI are those having general formula VII or VIII:

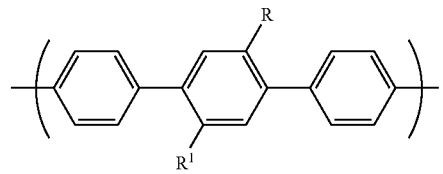
(VII)

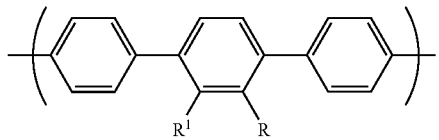
(VIII)

The position of R and $R^1$ on the middle phenyl groups of the above terphenyl repeat units is preferred because, where these repeat units are provided as monomeric units with reactive end groups, the monomeric units will polymerise to form the present polymer more readily when there are no substituent groups in the vicinity of the polymerisation sites. Substituent groups in the vicinity of the polymerisation sites could be expected to present a steric hindrance to polymerisation.

For the same reasons as set out above, although the present inventors expect that various R and $R^1$ groups will be useful in general formulae VI, VII and VIII, groups of particular current interest include alkyl and alkoxy groups such as methyl, hexyl, octyl, methoxy, hexyloxy and octyloxy groups for controlling the twist of the structural unit and/or increasing the solubility of the polymer. Generally, aryl or heteroaryl groups also are preferred, particularly substituted aryl or heteroaryl groups such as a substituted or unsubstituted phenylene group. More specifically, a substituted phenylene group, even more specifically an alkylated or alkoxylated phenylene group is preferred.

As mentioned above, the first structural unit having a general formula selected from VI, VII, or VIII may be further substituted. In this regard, the first structural unit may have a general formula IX or X:

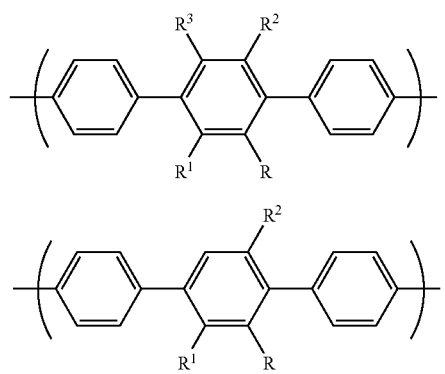

where R, $R^1$, $R^2$ and $R^3$ are the same or different from one another and each is as R and $R^1$ are defined above in relation to general formulae VI, VII and VIII.

For ease of manufacture or synthesis, generally, R and $R^1$ or $R^1$, $R^2$ and $R^3$ will be the same. However, this is not essential to the present invention.

In formulae IX and X above, it is preferred that each of R, $R^1$, $R^2$ and $R^3$ is a substituted or unsubstituted phenyl group. Where the phenyl group is substituted, it is preferred that the substituent is an alkyl or alkoxy group.

A further preferred specific first structural unit having general formula VI is a first structural unit having general formula XI:

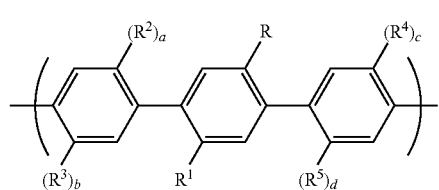

where R, $R^1$, $R^2$, $R^3$, $R^4$ and $R^5$ are the same or different from one another and each is as R or $R^1$ is defined above in relation to general formula VI, VII and VIII. In general formula XI: a, b, c and d=0 or 1 and a+b+c+d is $\geq 1$.

As more substituents are included on the terphenyl repeat unit, this increases steric interaction which leads to an increase in out of plane twisting of the polymer backbone. As set out above, this will result in a wider HOMO-LUMO bandgap of the polymer.

In one embodiment, it is preferred that in formula XI, R, $R^1$, $R^2$, $R^3$, $R^4$ and $R^5$ are the same and each is a methyl, hexyl, octyl, methoxy, hexyloxy or octyloxy group.

For ease of processing, it is preferred that at least 2 of $R^2$, $R^3$, $R^4$ and $R^5$ is hydrogen. Specifically, it is preferred that $R^3$ and $R^4$ each is hydrogen as shown in general formula XII below. Thus, where the terphenyl repeat unit is provided as a monomeric unit with reactive end groups, the monomeric unit will polymerise more readily since there will be no substituent groups in the vicinity of the polymerisation sites. It is envisaged that a substituent in the vicinity of a polymerisation site would present a steric hindrance to polymerisation.

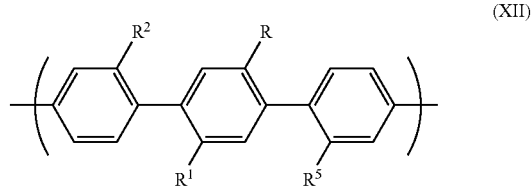

It will be understood from the above that whilst it is preferred that when m=2 in general formula I, the at least one substituent is situated on the middle phenyl group, this is not essential to the present invention. The at least one substituent may be located on one or other or both of the outer phenyl groups.

Where the first structural unit contains at least two substituents, it will be understood that is preferred that the at least two substituents are situated on the middle phenyl group. However, it will be understood that the at least two substituents may be located on one or other or both of the outer phenyl groups.

Referring to both the first embodiment and the second embodiment of the first aspect of the present invention, it is envisaged that polymers where Ar comprises a lumophore such as 2,7-linked 9,9 dialkyl fluorene, a 2,7-linked 9,9 diaryl fluorene, a 2,7-linked 9,9-spirofluorene, a 2,7-linked indenofluorene, a 2,5-linked benzothiadiazole, a 2,5-linked alkyl benzothiadiazole, a 2,5-linked dialkyl benzothiadiazole, a 2,5-linked substituted or unsubstituted thiophene or a triarylamine will be particularly useful. Each of these groups may be substituted. These groups are envisaged to be useful because of their potential to contribute to the properties of the resulting polymer, in particular to the conjugation of a polymer backbone. As explained above, the extent of conjugation to some extent controls the HOMO-LUMO bandgap of the polymer. Thus, Ar may be selected in order to select the colour (wavelength) of emission of the polymer.

Lumophores other than those mentioned above that give rise to emission from the polymer of light having a desirable wavelength also may be used.

Some specific groups that are envisaged to be useful as Ar are shown below and are denoted by reference numerals 1 to 21.

Units denoted by reference numerals 1-6 are useful when Ar=triarylamine:

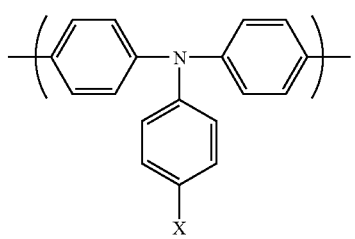

-continued

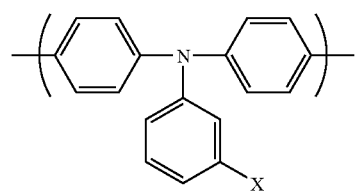
2

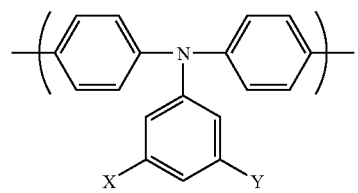
3

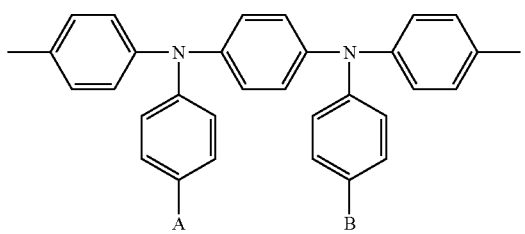
4

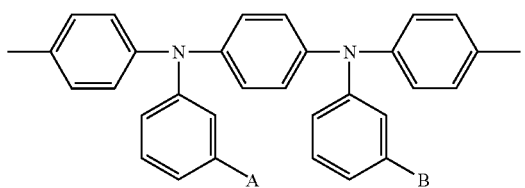
5

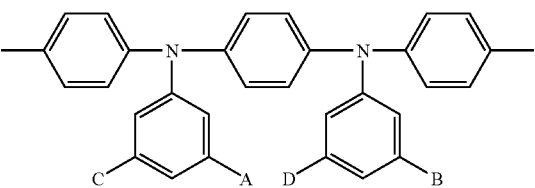
6

X and Y may be the same or different and are substituent groups. A, B, C and D may be the same or different and are substituent groups. It is preferred that one or more of X, Y, A, B, C and D is independently selected from the group consisting of alkyl, aryl, perfluoroalkyl, thioalkyl, cyano, alkoxy, heteroaryl, alkylaryl and arylalkyl groups. One or more of X, Y, A, B, C and D also may be hydrogen. It is preferred that one or more of X, Y, A, B, C and D is independently an unsubstituted, isobutyl group, an n-alkyl, an n-alkoxy or a trifluoromethyl group because they are suitable for helping to select the HOMO level and/or for improving solubility of the polymer.

Units denoted by reference numerals 7-21 are useful when Ar=heteroaryl:

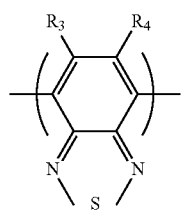
7 wherein $R_3$ and $R_4$ are the same or different and are each independently a substituent group. Preferably, one or more of $R_1$, $R_2$, $R_3$ or $R_4$ may be selected from hydrogen, alkyl, aryl, perfluoroalkyl, thioalkyl, cyano, alkoxy, heteroaryl, alkylaryl, or arylalkyl. These groups are preferred for the same reasons as discussed in relation to X, Y, A, B, C and D above. Preferably, for practical reasons, $R_3$ and $R_4$ are the same. More preferably, they are the same and are each a phenyl group.

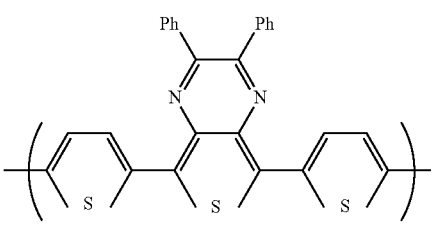
8

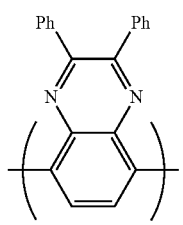
9

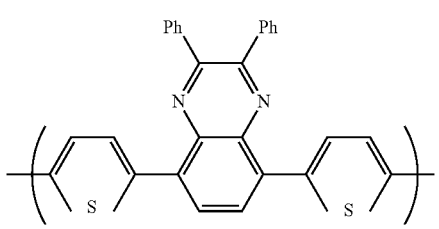
10

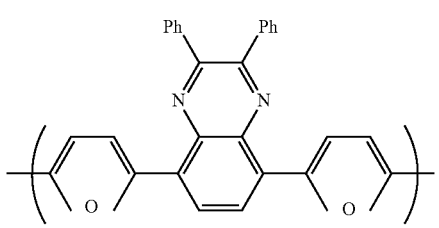
11

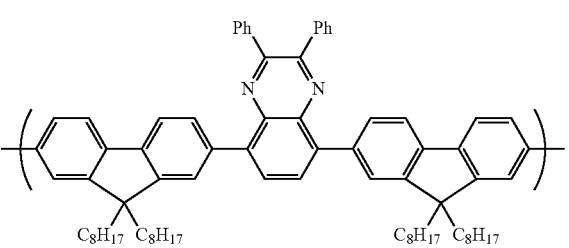
12

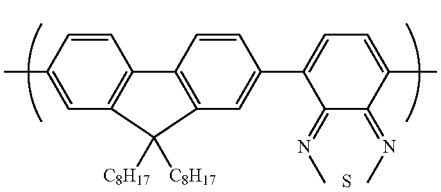
13

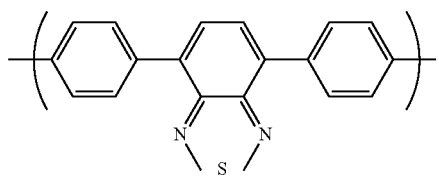

14

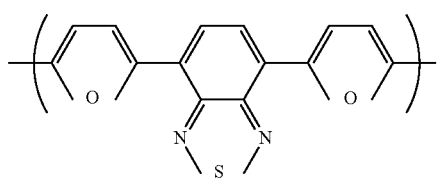

15

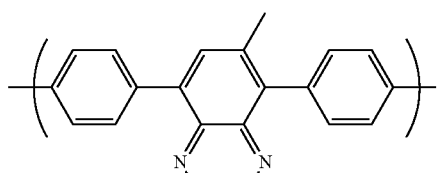

16

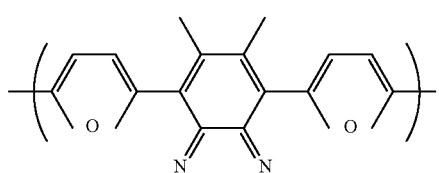

17

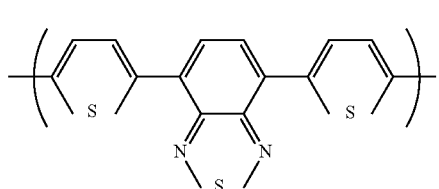

18

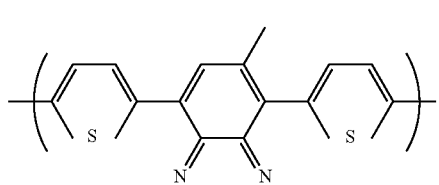

19

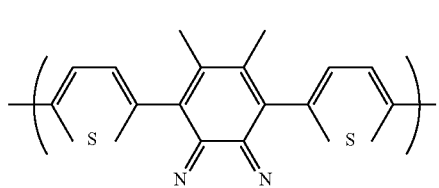

20

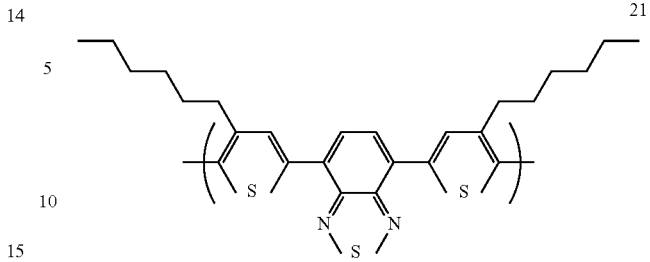

21

Further suitable Ar groups will be known in this art, specifically from WO 00/55927, the contents of which are incorporated herein by reference.

As explained above, it is an essential feature of the present invention that where m=1, the or each region comprises a unit having general formula II:

$$\text{—(first structural unit—Ar)—} \quad \text{(II)}$$

Thus, where Ar comprises, for example, a triarylamine, the first structural unit must be linked to the triarylamine via one of the aryl groups in order to be able to define a second structural unit Ar as required by the present invention. This is shown below using triphenylamine as an example:

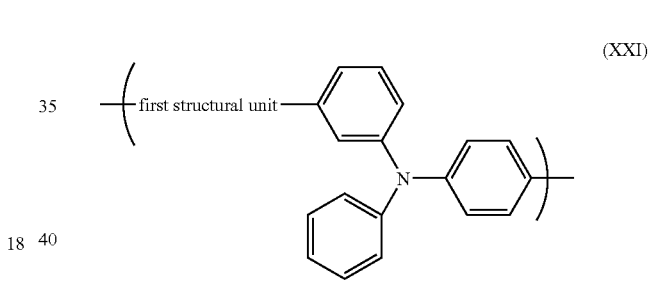

(XXI)

In fact, in formula XXI above, the first structural unit may be as the first structural unit is defined in either one of the first or second embodiments of the first aspect of the present invention described above.

In this regard, polymers based on the repeat unit having general formula XXII are envisaged to be useful.

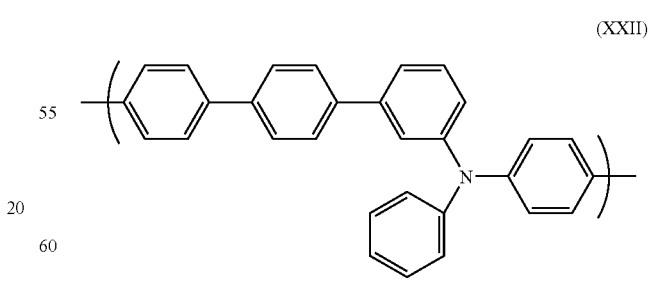

(XXII)

where the biphenyl is substituted in accordance with the invention and the triphenylamine is optionally substituted. In addition, it is preferred that where m=2, the or each region comprises a unit having general formula II.

It will be appreciated by a person skilled in this art that the nature of Ar will affect the properties of the polymer. Ar may be chosen to improve the hole and/or electron transporting properties of the region in which it resides and, thus, of the polymer as a whole.

Where it is desired for the or each region, and perhaps the whole polymer, to have good electron transport properties, Ar may be selected so that the or each region comprises a conjugated backbone. Consequently, the or each region will not have any so-called nodes preventing electron transport across the entire length of the or each region. An example of so-called node would be a nitrogen atom.

Where it is desired for the or each region, and perhaps the whole polymer, to have good hole transport properties, the or each region may include a node in the polymer backbone. To this end, it is preferred that Ar comprises a triarylamine as illustrated above. Preferred triarylamines are triphenylamines.

An example of a hole transport polymer according to the present invention would be a 1:1 copolymer consisting of a triarylamine second structural unit and a first structural unit selected from:

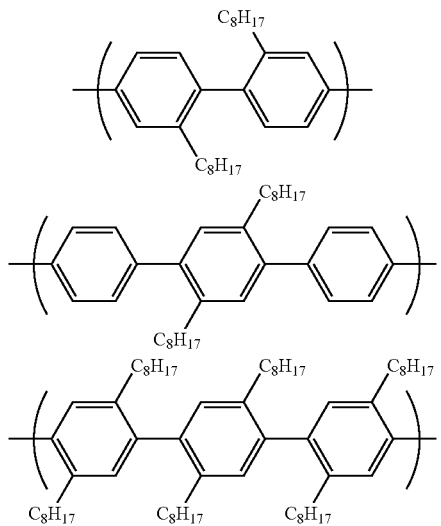

An example of an electron transport polymer according to the present invention would be 1:1 copolymer consisting of a benzothiadiazole second structural unit and a first structural unit selected from those shown above in relation to the hole transport polymer.

An example of a light-emitting polymer according to the present invention would be a terpolymer consisting of 50% of a first structural unit selected from those shown above in relation to the hole transport polymer; 25% of a benzothiadiazole structural unit and 25% of a structural unit as shown above by reference numeral 18.

A polymer according to the present invention may comprise a homopolymer, copolymer, terpolymer or higher order polymer. In this regard, a structural unit or repeat unit is distinguished from a monomeric unit. A homopolymer (i.e. prepared by polymerisation of a single type of monomer) may be defined to have a single type of monomeric unit and to have more than one different structural or repeat unit.

A copolymer, terpolymer or higher order polymer according to the present invention includes regular alternating, random and block polymers where the percentage of each monomer used to prepare the polymer may vary.

According to a second aspect of the present invention, there is provided the use of the present polymer as a component of an optical device. Specifically, the optical device may comprise an electroluminescent device.

For ease of processing, it is preferred that is the polymer is soluble. Substituents may usefully be selected to confer on the polymer solubility in a particular solvent system, for example for depositing the polymer on a substrate. Typical solvents include common organic solvents, toluene, xylene, THF and organic inkjet ink formulations.

The present polymer also may be used as a component of a photovoltaic device, a fluorescent dye or a detector or sensor, for example.

According to a third aspect of the present invention, there is provided an optical device or a component therefor which comprises a substrate and a polymer according to the first aspect of the present invention supported on the substrate. Preferably, the optical device comprises an electroluminescent device. More preferably, there is provided an electroluminescent device comprising a first charge injecting layer for injecting positive charge carriers, a second charge injecting layer for injecting negative charge carriers, and a light-emissive layer located between the first and second charge injecting layers comprising a light-emissive material for accepting and combining positive and negative charge carriers to generate light. The light-emissive layer comprises a polymer according to the first aspect of the present invention for (i) transporting negative charge carriers (electrons) from the second charge injecting layer to the light-emissive material (ii) transporting positive charge carriers (holes) from the first charge injecting layer to the light-emissive material or (iii) accepting and combining positive and negative charge carriers to generate light.

It will be appreciated that the light-emissive layer may be formed from a blend of materials including one or more polymers according to the present invention, and optionally further different polymers. As mentioned above, the one or more polymers according to the present invention may be included in order to improve the efficiency of hole and/or electron transport from the electrodes to the light-emissive material. Alternatively, they may be included as the light-emitting material itself.

One example of a blend including a polymer according to the present invention that could be used in an electroluminescent device is a blend consisting of >0.1% of the light-emitting polymer defined above and a hole transport polymer.

Alternatively, a polymer according to the present invention may be provided in an electroluminescent device as a discrete layer situated between either the first or second charge injecting layer and the light-emissive layer. Also, it may be provided as a discrete layer which is the light-emissive layer. These discrete layers optionally may-be in contact with one or more (additional) hole and/or electron transporting layers.

Several different polymerisation methods are known which may be used to manufacture polymers in accordance with the present invention.

One particularly suitable method is disclosed in International patent publication No. WO 00/53656, the contents of which are incorporated herein by reference. This describes the process for preparing a conjugated polymer, which comprises polymerising in a reaction mixture (a) an aromatic monomer having at least two reactive boron derivative groups selected from a boronic acid group, a boronic ester group and a borane group, and an aromatic monomer having at least two reactive halide functional groups; or (b) an aromatic monomer having one reactive halide functional group and one reactive boron derivative group selected from a boronic acid group, a boronic ester group and a borane group, wherein the reaction mixture comprises a catalytic amount of a catalyst suitable for catalysing the polymerisation of the aromatic monomers, and an organic base in an amount sufficient to convert the reactive boron derivative functional groups into active polymerisable units, particularly —BX$_3^-$ anionic groups, wherein X is independently selected from the group consisting of F and OH.

Polymers according to the present invention which have been produced by this method are particularly advantageous. This is because reaction times are short and residual catalyst (e.g. palladium) levels are low.

Another polymerisation method is disclosed in U.S. Pat. No. 5,777,070. The process involves contacting monomers having two reactive groups selected from boronic acid, C1-C6 boronic acid ester, C1-C6 borane and combinations thereof with aromatic dihalide functional monomers or monomers having one reactive boronic acid, boronic acid ester or borane group and one reactive halide functional group with each other.

A further polymerisation method is known from "Macromolecules", 31, 1099-1103 (1998). The polymerisation reaction involves nickel-mediated coupling of dibromide monomers. This method commonly is known as "Yamamoto Polymerisation".

According to a fourth aspect of the present invention there is provided a process for preparing a polymer as defined above which comprises polymerising in a reaction mixture:
(a) a first aromatic monomer comprising
 (i) a first structural unit as defined in any embodiment above; and/or
 (ii) a second structural unit [Ar] as defined above, and at least two reactive boron derivative groups selected from a boronic acid group, a boronic ester group and a borane group; and
(b) a second aromatic monomer comprising the other or further of the first and/or second structural units and at least two reactive halide functional groups,
wherein the reaction mixture contains a catalytic amount of a palladium catalyst, and a base in an amount sufficient to convert the reactive boron derivative groups into active polymerisable units, particularly —B(OH)$_3$ anions.

A further process according to the fourth aspect of this invention for preparing a polymer as defined above also is provided which comprises polymerising in a reaction mixture:
(a) a first aromatic monomer comprising
 (i) a first structural unit as defined in any embodiment above; and/or
 (ii) a second structural unit [Ar] as defined above, and one reactive halide functional group and one reactive boron derivative group; and
(b) a second aromatic monomer comprising the other or further of the first and/or second structural units, and one reactive halide functional group and one reactive boron derivative group, wherein each borane derivative group is selected from a boronic acid group, a boronic ester group and a borane group and the reaction mixture contains a catalytic amount of a palladium catalyst, and abase in an amount sufficient to convert the reactive boron derivative groups into active polymerisable units, particularly —B(OH)$_3^-$ anions.

Preferably, the base is an organic base such as a tetra-alkyl ammonium hydroxide or tetra-alkyl ammonium carbonate.

Preferably, each first and second aromatic monomer has only two reactive groups selected from boron derivative groups and halide functional groups in order to provide a linear polymer.

A film of a polymer according to the first aspect of the present invention also is provided. Further, a coating of a polymer according to the first aspect of the present invention is provided.

BRIEF DESCRIPTION OF THE DRAWING

The present invention now will be described in further detail with reference to the following drawings, in which.

MONOMER SYNTHESIS

Figure 1:
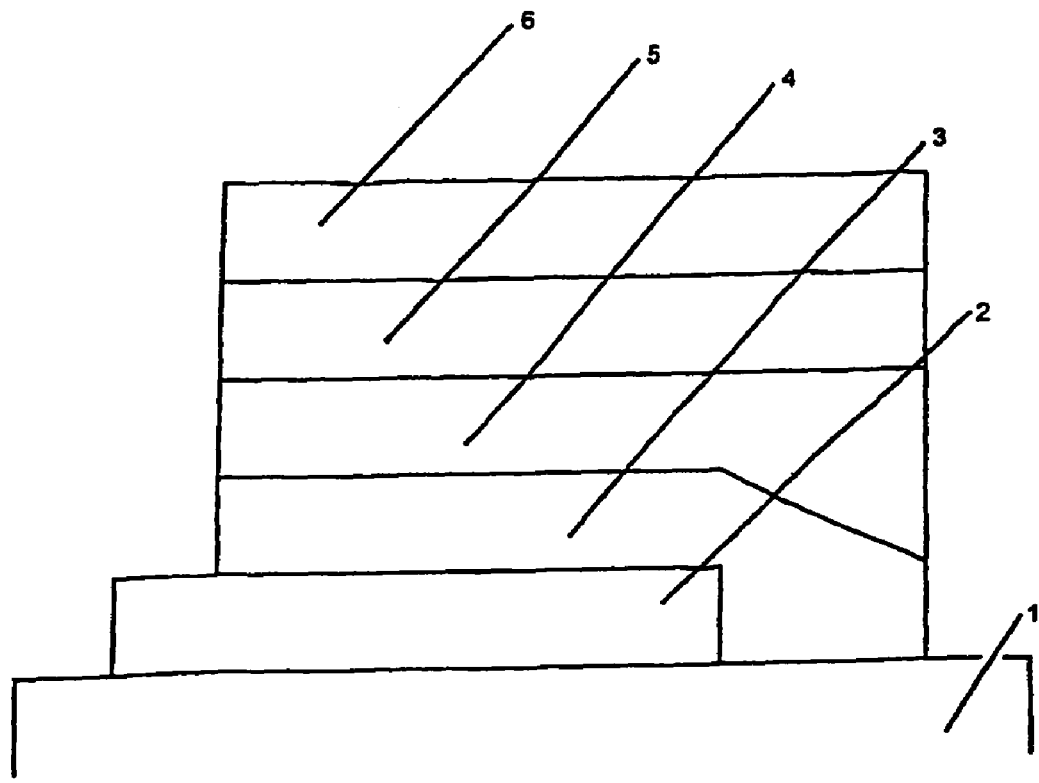
FIG. 1 shows a schematic diagram of an electroluminescent device according to the present invention.

Synthetic methodologies for monomers that may be polymerised to form repeat units of formula (I) of claim 1 are outlined below.

Preparation of a Monoalkyl Biphenyl Monomer(Two Routes, A&B)

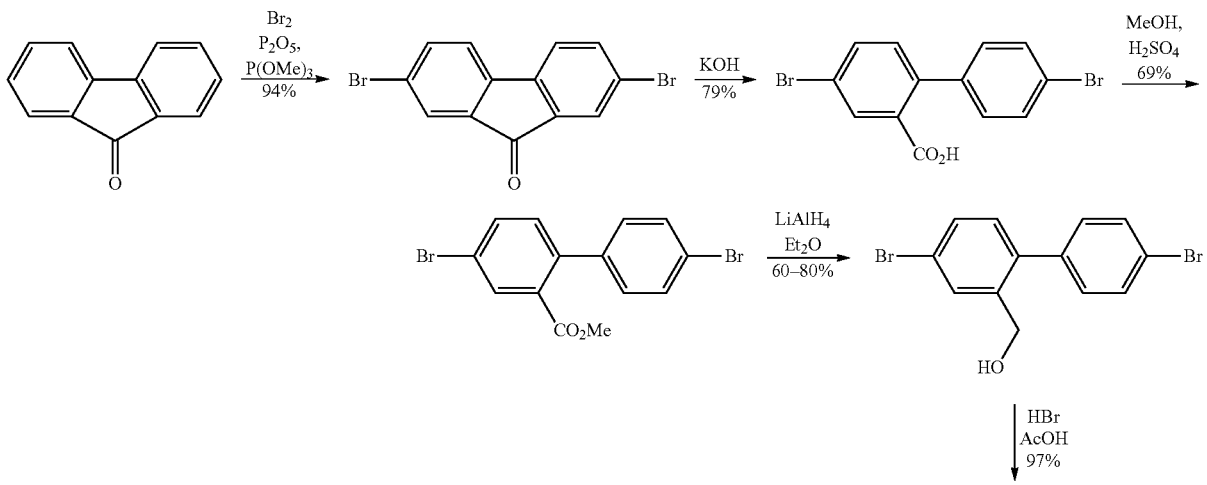

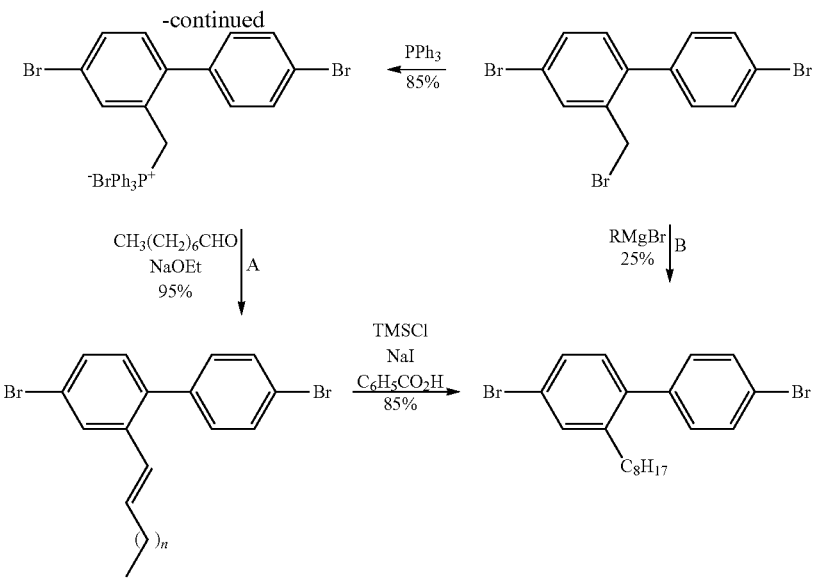
Preparation of a Dialkylbiphenyl Monomer
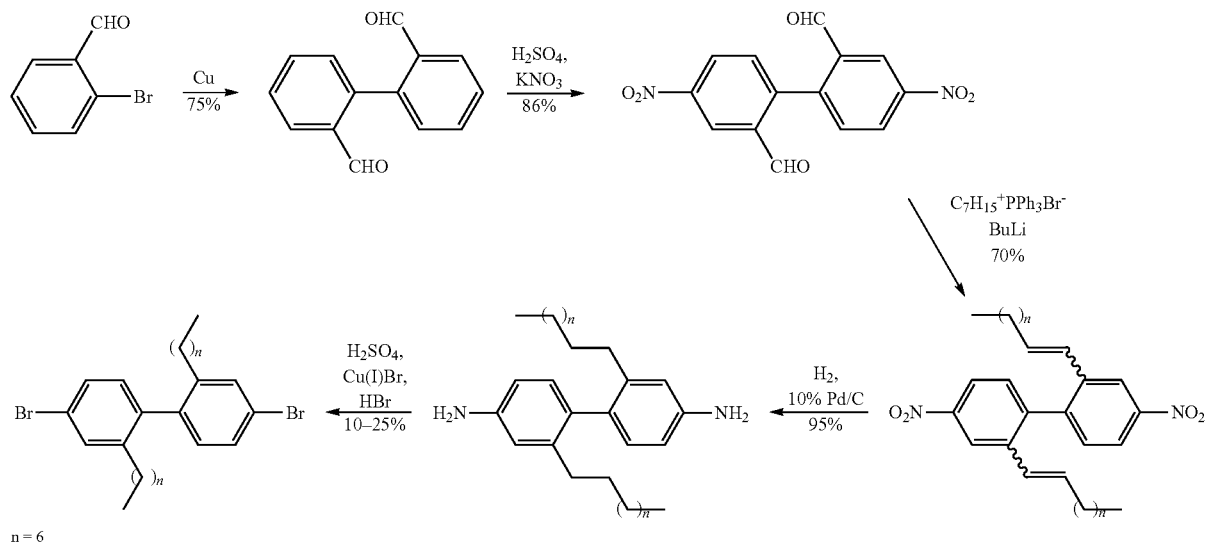
Preparation of a Dialkylbiphenyl Monomer (Route 2)
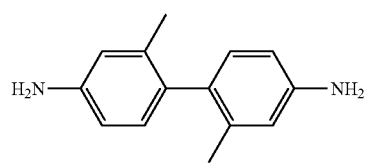

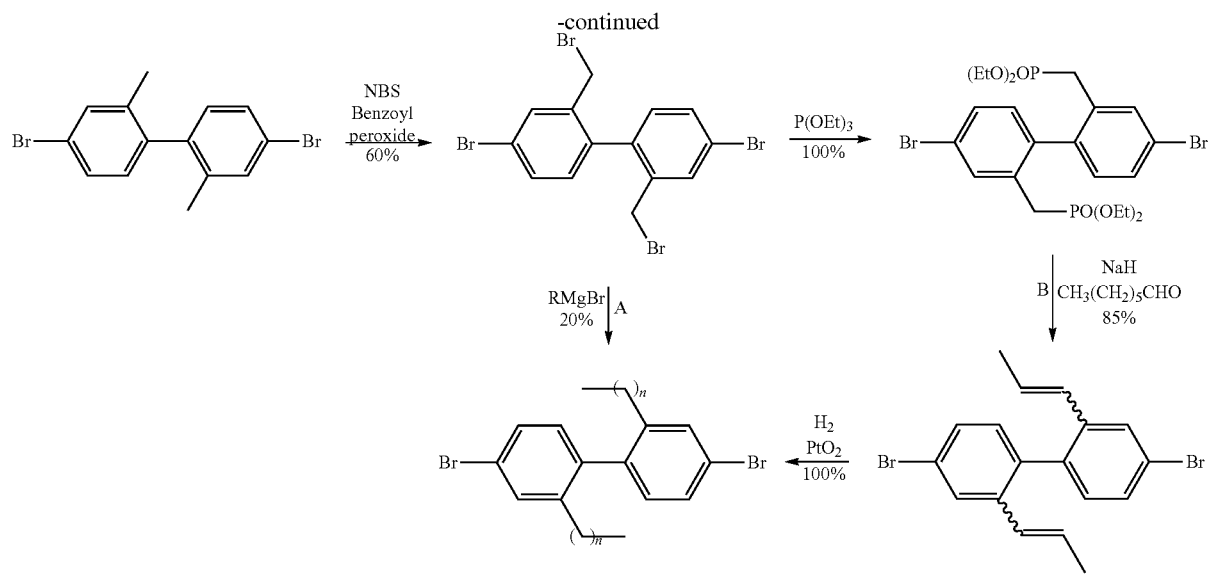
Preparation of a Dialkylbiphenyl Monomer (Route 3)
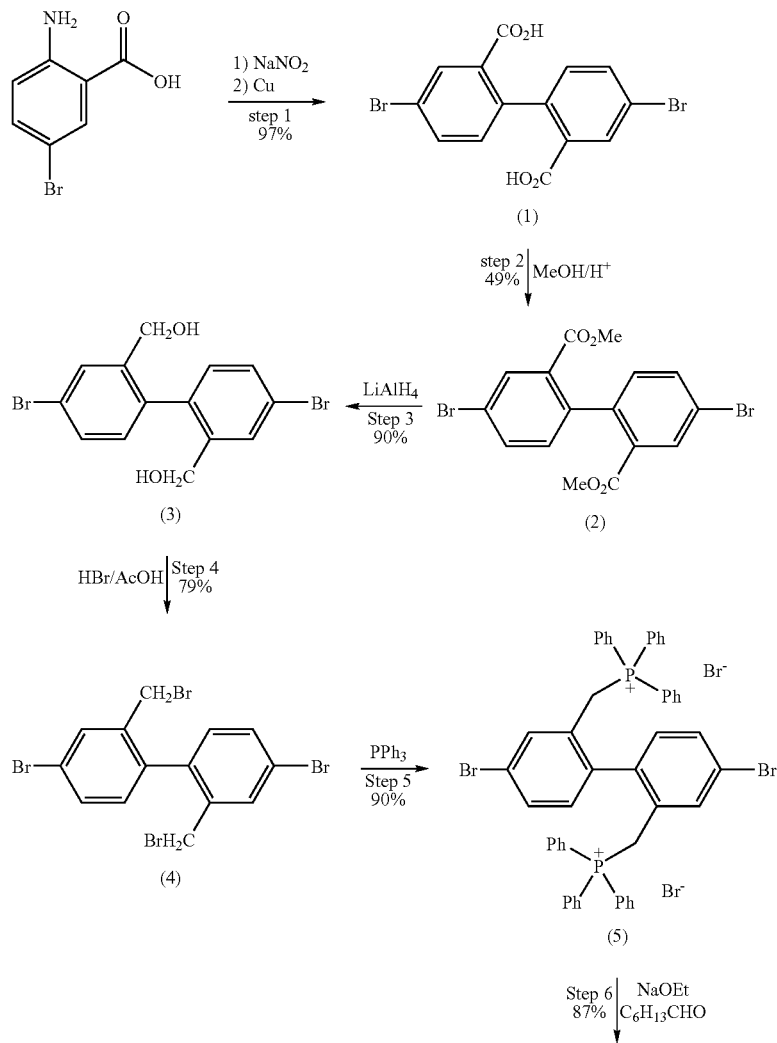

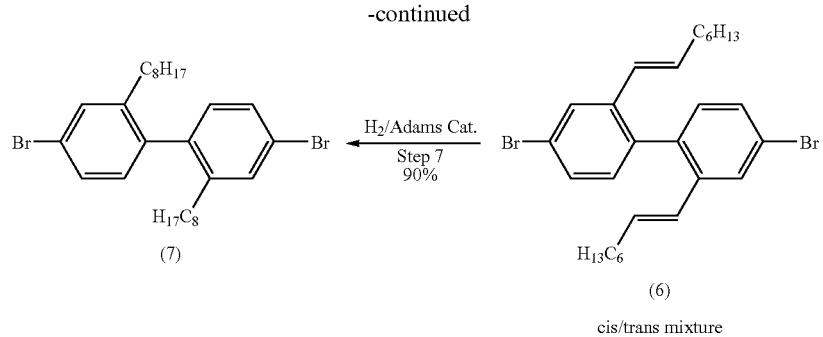
Preparation of a Dialkylated Terphenyl Monomer
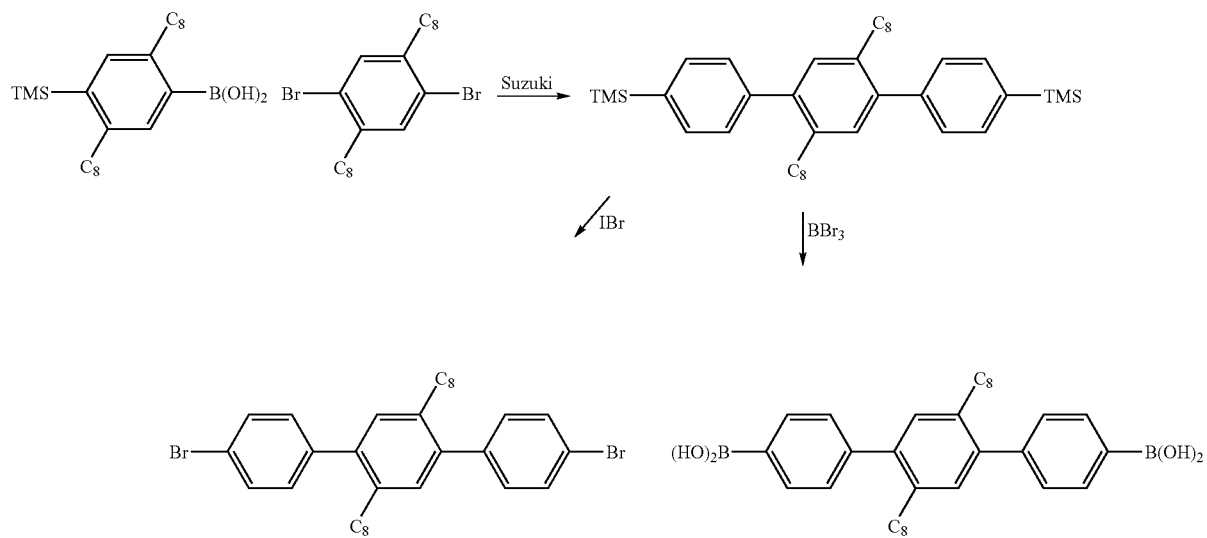
Preparation of an Hexa-Alkylated Terphenyl Monomer
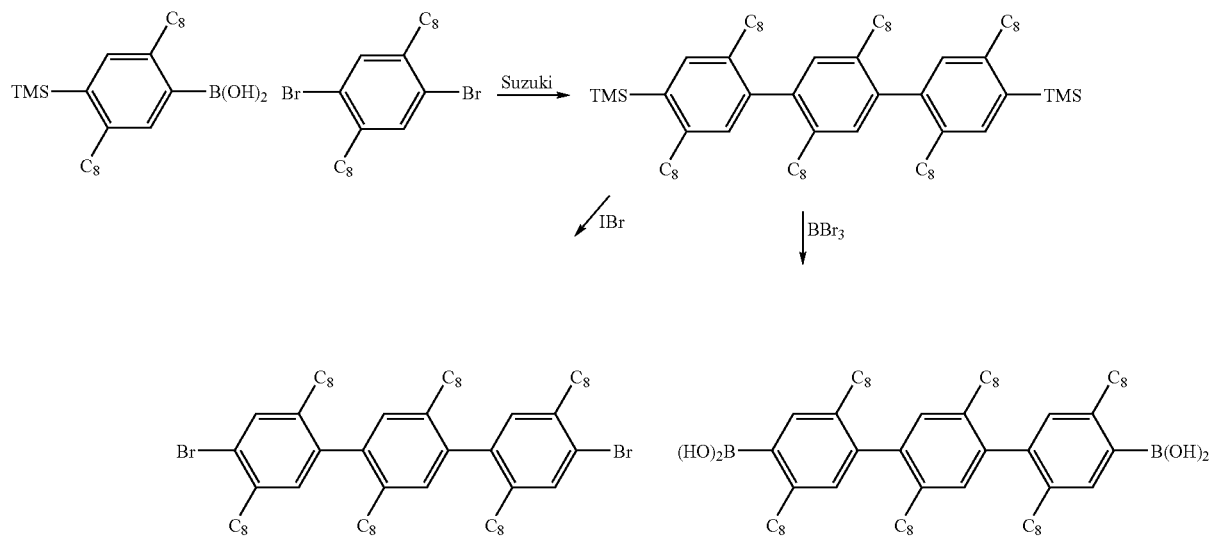

Preparation of a Phenylated Terphenyl Monomer

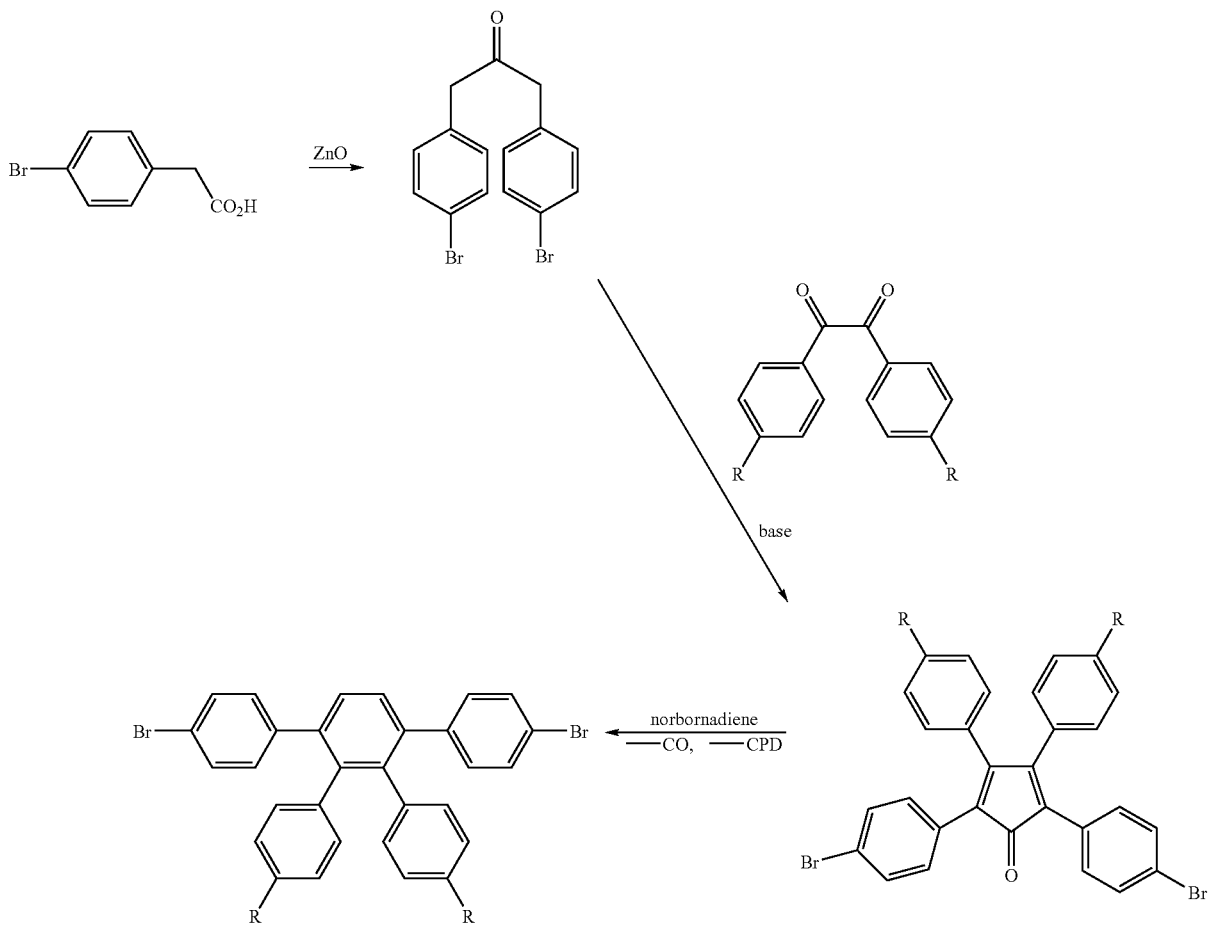

EXAMPLES

Part A—Monomer Synthesis

Monomer Example 1

4,4'-dibromo-2-decyl-1,1'-biphenyl 2,7-Dibromofluorenone

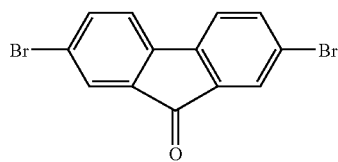

In a 3 L flange flask fluorenone (100.006 g, 0.555 mol), phosphorus pentoxide (110.148 g, 0.776 mol) and trimethylphosphate (1200 mL) were mixed. Under mechanical stirring, a solution of bromine (63 mL, 1.23 mol) in trimethylphosphate (200 mL) was quickly added. This clear solution was then heated for 22 hours at 120° C. The mixture was allowed to cool to room temperature, then poured into 3 L of water. When sodium thiosulfate was added (50.045 g) the mixture turned yellow. Stirring was maintained for 1 hour then the yellow solid was filtered. This solid was heated in methanol to remove the mono-brominated compound and gave 176.183 g (98% pure by HPLC, 94% yield).

$^1$H NMR (CDCl$_3$) 7.73 (2H, d, J 2.0), 7.61 (2H, dd, J 7.6, 2.0), 7.36 (2H, d, J 8.0); $^{13}$C NMR (CDCl$_3$) 142.3, 137.5, 135.3, 127.9, 123.3, 121.8, 109.8.

4,4'-Dibromo-2-carboxylic acid-1,1'-biphenyl

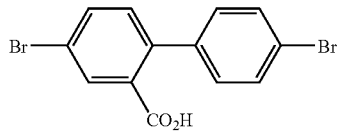

In a 2 L flange flask 2,7-dibromofluorenone (120.526 g, 0.356 mol), potassium hydroxide (finely powdered flakes, 168.327 g, 3.000 mol) and toluene (600 mL) were placed. This mixture was heated at 120° C. for four hours then left to cool to room temperature. Water was added to dissolve the solid (~2 L) under vigorous stirring. The greenish aqueous layer was removed and the yellow toluene layer was washed twice with water. The combined aqueous layers were acidified with concentrated hydrochloric acid then the precipitated solid was filtered, dried then recrystallised from toluene to give 100.547 g of off white crystals (79% yield); $^1$H NMR ((CD$_3$)$_2$CO) 8.00 (1H, d, J 2.0), 7.77 (1H, dd, J 8.0, 2.4), 7.57 (2H, d, J 8.0), 7.34 (1H, d, J 8.4), 7.29 (2H, d, J 8.8); $^{13}$C NMR ((CD$_3$)$_2$CO) 167.1, 140.4, 139.8, 134.2, 133.5, 132.8, 132.7, 131.2, 130.6, 121.4, 121.1.

4,4'-Dibromo-2-methyl ester-1,1'-biphenyl

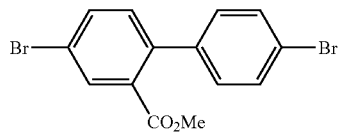

4,4-dibromo-2-carboxylic acid biphenyl (171.14 g, 0.481 mol) was suspended in methanol (700 mL) and sulfuric acid (15 mL) then heated at 80° C. for 21 hours. The solvent was removed and the oil was dissolved in ethyl acetate. This solution was washed with 2N sodium hydroxide, water, saturated sodium chloride, dried over magnesium sulfate, filtered and evaporated to give an orange oil. This oil was treated with hot methanol, on cooling the ester precipitated out and was filtered. The mother liquor was evaporated and the solid recrystallised giving additional product. The ester was 100% pure by GCMS, a yield of 123.27 g (69%) was obtained; $^1$H NMR (CDCl$_3$) 7.99 (1H, d, J 2.0), 7.64 (1H, dd, J 8.0, 1.6), 7.51 (2H, d, J 8.4), 7.19 (1H, d, J 8.8), 7.13 (2H, d, J 8.8), 3.67 (3H, s); $^{13}$C NMR (CDCl$_3$) 167.1, 140.3, 139.1, 134.4, 132.9, 132.1, 132.0, 131.3, 129.8, 121.9, 121.5, 52.3; GCMS: M$^+$=370

4,4'-Dibromo-2-methyl alcohol-1,1'-biphenyl

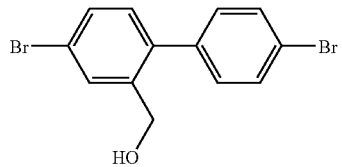

4,4'dibromo-2-methyl ester biphenyl (20 g, 54 mmol) was dissolved in dry ether (300 ml) in a dry 3-necked flask. Lithium aluminium hydride (76 ml, 1M in THF, 76 mmol) was added dropwise with stirring. When the addition was complete an oil bubbler was attached and ethyl acetate was added in aliquots until no more gas evolution was seen. Water (10 ml) was carefully added, followed by 20% H$_2$SO$_4$ (200 ml). The organic layer was separated and the aqueous layer extracted with ethyl acetate. The organic fractions were combined, washed with water, dried over magnesium sulphate, filtered and evaporated to give a white solid, which was recrystallised from methanol. A yield of 16.4 g (89%) was obtained; $^1$H NMR (CDCl$_3$): 7.73 (1H, d, J 2.5 Hz), 7.55 (2H, dt, J 8.3, 2.2 Hz), 7.48 (1H, dd, J 8.3, 3.7 Hz), 7.20 (2H, dt, J 8.3, 2.2 Hz), 7.10 (1H, d, J 8.3 Hz), 4.50 (2H, s);GCMS: M$^+$=342

4,4'-Dibromo-2-bromomethyl-1,1'-biphenyl

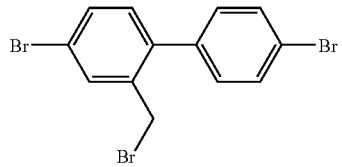

4,4'-Dibromo-2-methyl alcohol-1,1'-biphenyl (15.4 g, 45 mmol), 30% HBr in acetic acid (30 ml) and glacial acetic acid (40 ml) were heated to 80° C. for 19 hours. Once the reaction mixture had cooled, water (200 ml) was added and the mixture stirred. The white solid was filtered, washed with plenty of water and dried to give 17.75 g (97%) of 100% pure material (GCMS); $^1$H NMR (CDCl$_3$): 7.66 (1H, d, J 2.36 Hz), 7.58 (2H, dt, J 8.39, 4.98 Hz), 7.47 (1H, dd, J 7.86, 2.36 Hz), 7.28 (2H, dt, J 8.12, 5.24 Hz), 7.08 (1H, d, J 8.12 Hz), 4.30 (2H, s); $^{13}$C NMR (CDCl$_3$): 139.9, 138.2, 137.4, 134.0, 132.0, 131.96, 131.9, 130.7, 122.5, 122.2, 30.7;GCMS: M$^+$=405

4,4'-Dibromo-2-(triphenylphosphinomethylene bromide)-1,1'-biphenyl

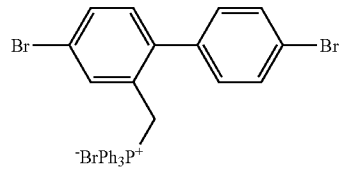

4,4'-Dibromo-2-bromomethyl-1,1'-biphenyl (36.85 g, 90 mmol), triphenylphosphine (25.06 g, 96 mmol) and DMF (500 ml) were heated to 120° C. for 18 hours. After cooling, the solvent was removed and the white solid dissolved in dichloromethane. The solution was then triturated with hexane, giving 51.6 g (85%) of a white dusty solid.

4,4'-Dibromo-2-(n-decyl-1-ene)-1,1'-biphenyl

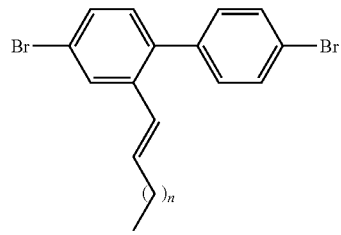

All of the glassware was dried in an oven overnight then set up under a flow of nitrogen. 4,4'-Dibromo-2-(triphenylphosphinomethylene bromide)-1,1'-biphenyl (15 g, 22.5 mmol) was dissolved in absolute ethanol (250 ml) then nonyl aldehyde (5.85 ml, 33.7 mmol) was added. The mixture was heated to 75° C. and sodium ethoxide (21wt % in absolute ethanol, 9.1 ml, 28 mmol) added dropwise. Heating was stopped after 4 hours; after the reaction vessel had cooled water (150 ml) was added and the solution extracted three times with dichloromethane. The combined organic phases were dried (MgSO$_4$) then the solvent was removed. The side-product of triphenylphosphine oxide was removed by washing the mixture with hexane and filtering off the insoluble oxide. The alkene was purified by column chromatography (hexane eluant), affording 9.7 g (95%) of a colourless oil; Reference: U.S. Pat. No. 5,728,480, Mar. 17 1998.

4,4'-Dibromo-2-decyl-1,1'-biphenyl

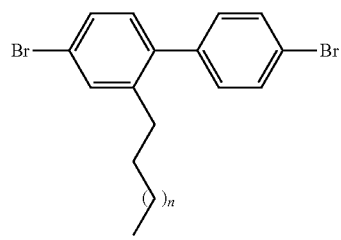

4,4-Dibromo-2-(n-decyl-1-ene)-1,1'-biphenyl (3 g, 6.66 mmol), benzoic acid (0.814 g, 6.66 mmol), sodium iodide (2.996 g, 19.99 mmol) trimethylsilyl chloride (2.55 ml, 19.99 mmol) and acetonitrile (20 ml) were stirred under nitrogen for one hour at room temperature. The mixture was then heated to 75° C. for three hours. When the reaction vessel had cooled the contents were diluted with ethyl acetate, transferred to a separating funnel and washed with sodium thiosulfate and sodium hydrogen carbonate. The organic phase was dried over magnesium sulfate and evaporated, giving 2.79 g of crude material (91.1% pure by GCMS, 84% yield). The purity was improved by column chromatography (hexane eluant); Reference: Ghera, E. et al, *Tetrahedron Lett.*, 1989, 30, 35, 4741-4744

Monomer Example 2

4,4'-dibromo-2,2'-dioctyl-1,1'-biphenyl

Preparation of 2,2-dicarbaldehyde biphenyl

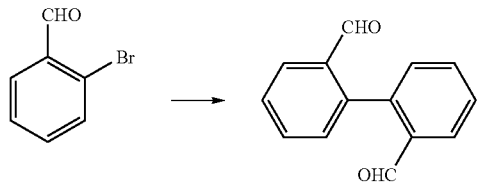

2-bromo benzaldehyde (266 g, 1.35 mol) was heated to 185° C. and then copper powder (201.16 g, 3.17 mmol) was added portion wise to the liquid. After 30 mins, DMF (100 mL) was added to the solution and heating maintained for a further 8 h. After cooling to room temperature the product was dissolved in toluene and filtered through celite. Purification via column chromatography eluting with Hexane:EtOAc (6:1) gave a foam. Recrystallisation from Et$_2$O/hexane gave 73.27 g (50% yield); $^1$H NMR (CDCl$_3$) 9.81 (2H, s), 8.04 (2H, d, J 7.6), 7.65 (2H, dt, J 1.2, 7.2), 7.58 (2H, t, J 7.2), 7.34 (2H, d, J 7.6); $^{13}$C NMR 114.05, 119.97, 121.68, 123.54, 140.54.

Preparation of 4,4-dinitro-2, 2-dicarbaldehyde biphenyl

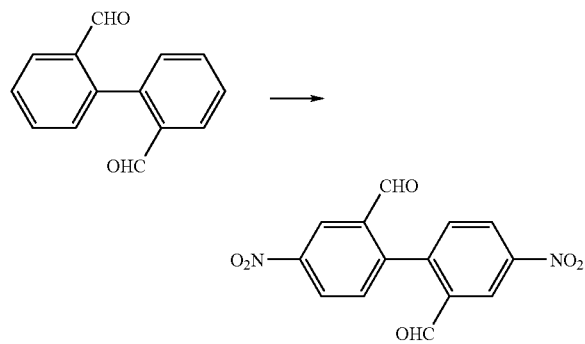

To a cooled mixture (0° C.) of 2,2-carbaldehyde biphenyl (68.76 g, 32.7 mmol) and concentrated H$_2$SO$_4$ (33 mL, d 1.84) was added (dropwise) a cooled solution. (0° C.) of conc. H$_2$SO$_4$ (294 mL, d 1.84) and potassium nitrate (81.8 g, 0.00 mol). Once addition was complete stirring was continued at 0° C. for 1 hour and then allowed to warm to r.t.. After 1 hour, the reaction mixture was quenched, pouring into water. A solid precipitated out, this was collected and then stirred vigorously in a solution of sodium carbonate. After filtration the powder was washed with water and then dissolved in toluene. On cooling the desired product precipitated out as a yellow powder. Recrystallisation from acetone gave 52.39 g (53%). The mother liquor afforded a further 32.38 g (33%). $^1$H NMR (Acetone-D6) 9.98 (2H, s), 8.86 (2H, d, J 2.0), 8.63 (2H, dd, J 2.4, 8.4), 7.85 (2H, d, J 8.4); $^{13}$C NMR 124.70, 127.60, 133.17, 135.78, 145.19, 148.86, 189.65.

Preparation of 4,4-dinitro-2,2-alkenyl biphenyl

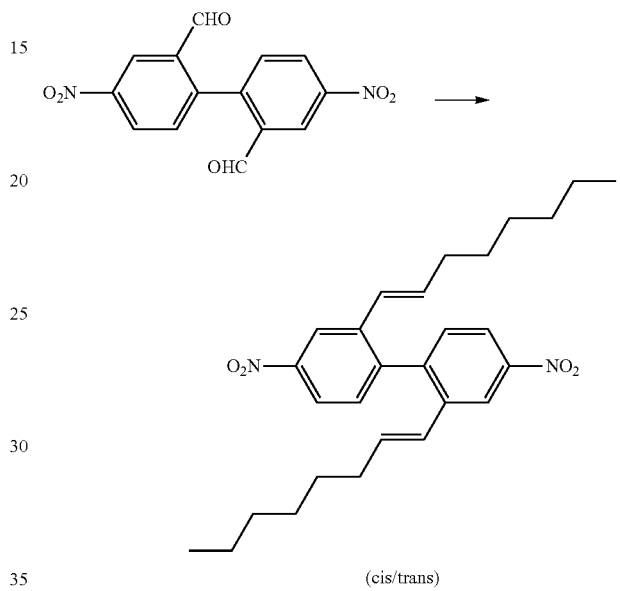

(cis/trans)

Butyl lithium (14.4 mL, 35 mmol, 2.5M solution in hexane) was added dropwise at room temperature to a suspension of n-heptyl triphenylphosphonium bromide (16.172 g, 36.6 mmol). To ensure complete formation of the ylide, the reaction mixture was left stirring at room temperature for 6 hours. The clear red coloured ylide was then added dropwise to a cooled (0° C.) suspension of 4,4-dinitro-2,2-alkenyl biphenyl (5 g, 16.7 mmol). The reaction mixture was allowed to warm to room temperature and stirring was continued overnight. The triphenylphosphine was filtered off as a white powder and the solvent evaporated to dryness. The residue was purified by column chromatography gave 4.649 g (60%).

Preparation of 4,4 diamino-2,2-bis octyl biphenyl

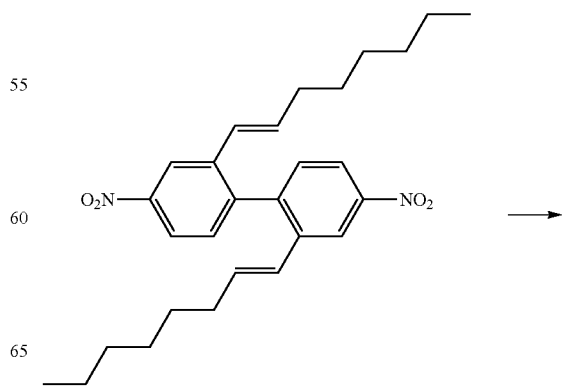

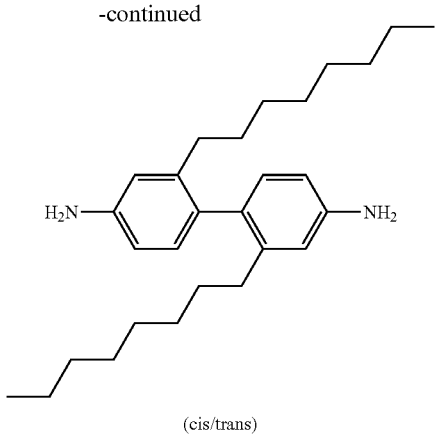

(cis/trans)

4,4 dinitro-2,2-bis alkenyl biphenyl (32 g, 79.1 mmol) was dissolved in absolute ethanol (300 mL) and a solution of potassium formate (80.44 g, 0.96 mol) and water (51.92 g, 2.9 mol) added. The reaction mixture was heated to 70° C. and then palladium on carbon (10%, 1.5 g) was added. After 18 h of heating the palladium was filtered off through celite and the inorganic solid was washed through with water. The ethanol was removed under vacuum and then EtOAc was added. The aqueous layer was washed several times with EtOAc. The combined organic phases dried and evaporated under vacuum, affording 21.49 g (67%) of desired material (colourless oil).

Preparation of 4,4-dibromo-2,2-bis octyl biphenyl

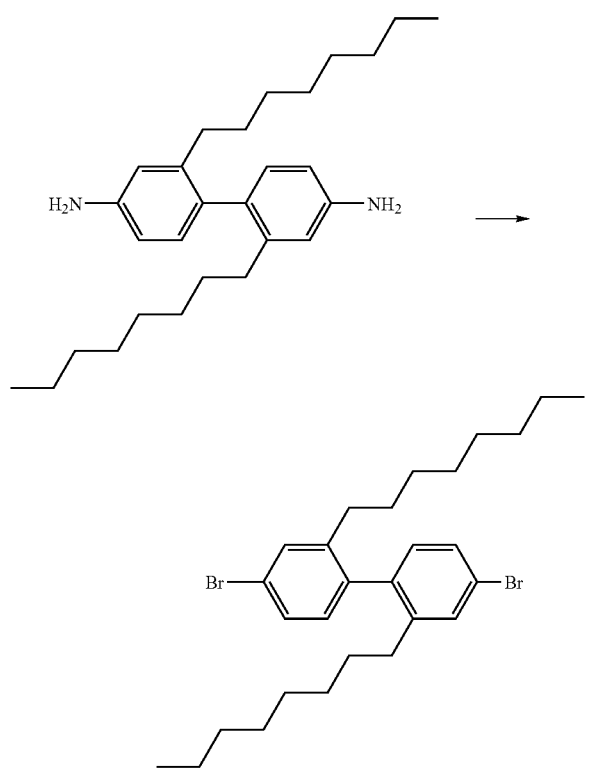

A suspension of 4,4-diamino 2,2-dioctyl biphenyl (2.1 g) and 10% $H_2SO_4$ (11.35 mL) was cooled to 0° C. A solution of sodium nitrite (780 mg, mmol) in water (7.24 mL) was slowly added, maintaining the temperature below 3° C. The solution was re-cooled to 0° C. and stirred for a further 30 minutes. A solution of copper (I) bromide (7.75 g, mmol) in HBr (48%, 77.5 mL) was prepared. After cooling the, solution to −20° C. the diazonium salt was added slowly. The reaction mixture was stirred for 5 mins at −20° C. then allowed to warm to room temperature. The reaction mixture was then heated to 50° C. for 3 h then allowed to cool to r.t. and left to stand O/N. The product precipitated out as a solid and was filtered off. The solid was washed with sodium thiosulfate and water. Purification using column chromatography gave 2.4 g a mixture of mono-bromo precursor and product. Kuger distillation gave 950 mg of desired product (34.6%). Crude GC-MS indicated 63% product and 30% mono bromo precursor; $^1$H NMR (CDCl$_3$) 7.42 (2H, d, J 1.6), 7.34 (2H, dd, J 2.0, 8.4), 6.93 (2H, d, J 7.6), 2.33-2.20 (4H, m), 1.40-1.38 (4H, m), 1.27-1.14 (20H, m), 0.88 (6H, t, J 6.4); $^{13}$C NMR 143.283, 138.899, 131.961, 131.519, 128.675, 121.691, 33.146, 32.025, 30.721, 29.532, 29.410, 29.280, 22.838, 14.284.

Part B—Polymer Preparation

Polymers according to the invention were prepared by Suzuki polymerisation of a 50:50 reaction mixture of first and second aromatic monomers in accordance with the method of WO 00/53656 to furnish AB copolymers as illustrated below.

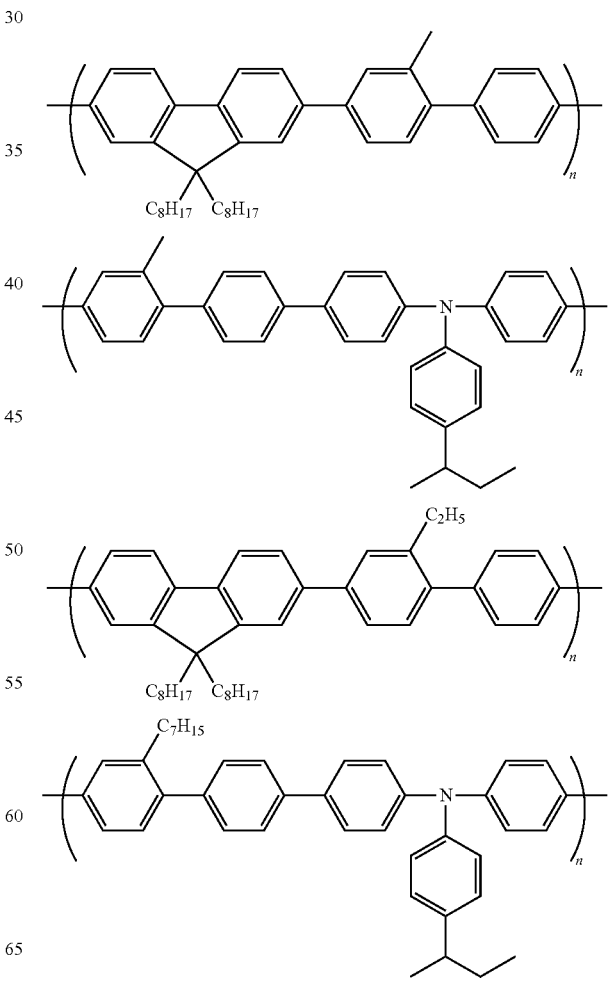

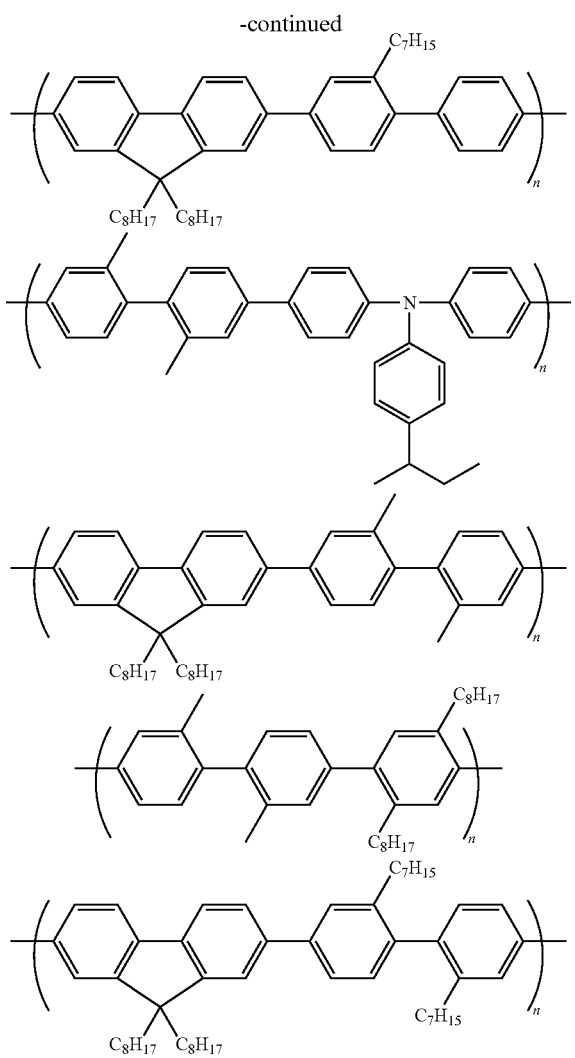

Part C—An Optical Device

A suitable device structure is shown in FIG. 1. The anode 2 is a layer of transparent indium-tin oxide ("ITO") supported on a glass or plastic substrate 1. The anode 2 layer has a thickness between 1000-2000 Å, usually about 1500 Å. The cathode 5 is a Ca layer having an approximate thickness of 1500 Å. Between the electrodes is a light emissive layer 4 having a thickness up to about 1000 Å. The emissive layer 4 comprises between 0.1 to 100% by weight of a light-emitting polymer according to the present invention with the remainder of the emissive layer consisting of hole transport material.

Advantageously, the device includes a hole transport material layer 3 of PEDOT having a thickness of about 1000 Å. Layer 6 is an encapsulant layer of a suitable thickness.

The invention claimed is:

1. A polymer for use in an optical device comprising one or more regions, where the region comprises:
(i) a first structural unit having general formula I:

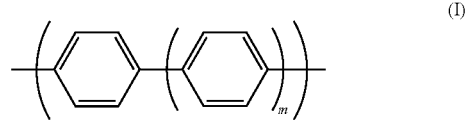

where m=1 or 2 and which contains at least one substituent, the substituent: (a) positioned such that when the first structural unit is provided as a monomeric unit with reactive end groups, there are no substituent groups in the vicinity of the reactive end groups, (b) selected from the group consisting of alkyl, alkoxy, aryl, aryloxy, heteroaryl and heteroaryloxy groups, each of which may be further substituted, and (c) causing the first structural unit to twist out of the plane of the polymer backbone such that the conjugation of the polymer is decreased relative to a polymer not having a twist; and (ii) a second structural unit Ar selected from the group consisting of heteroaryl, triarylamine and 2,7-fluorenyl;

such that the region comprises a unit having general formula II:

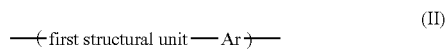

wherein the substituent has a molecular weight of less than 300.

2. A polymer according to claim 1, wherein the first structural unit contains a plurality of substituents, and each substituent has a molecular weight of less than 300.

3. A polymer according to claim 2, wherein each substituent comprises less than 20 carbon atoms.

4. A polymer for use in an optical device comprising one or more regions, where the region comprises:
(i) a first structural unit selected from those having general formula II:

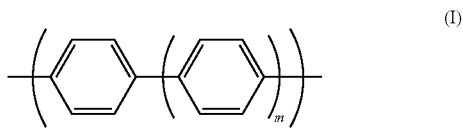

where m=1 or 2 and which contains at least one substituent, the substituent (a) selected from the group consisting of an alkyl, alkoxy, aryl, aryloxy, heteroaryl and heteroaryloxy groups, each of which may be further substituted, where when m=1, (b) positioned such that when the first structural unit is provided as a monomeric unit with reactive end groups, there are no substituents in the vicinity of the reactive end groups; and when m=2, the first structural unit contains at least two substituents that are situated on the middle phenyl group, and (c) causing the first structural unit to twist out of the plane of the polymer backbone such that the conjugation of the polymer is decreased relative to a polymer not having a twist; and (ii) a second structural unit Ar selected from the group consisting of heteroaryl, triarylamine and 2,7-fluorenyl;

such that the region comprises a unit having general formula II:

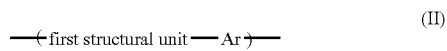

wherein the substituent has a molecular weight of less than 300.

5. A polymer according to claim 4, wherein the first structural unit contains a plurality of substituents, and each substituent has a molecular weight of less than 300.

6. A polymer according to claim 5, wherein each substituent comprises less than 20 carbon atoms.

7. A polymer according to claim 1, wherein m=2.

8. A polymer according to claim 4, wherein m=2.

9. An optical device comprising a substrate and a polymer according to claim 1 supported on the substrate.

10. An electroluminescent device comprising:
- a first charge injecting layer for injecting positive charge carriers;
- a second charge injecting layer for injecting negative charge carriers;
- a light-emissive layer located between the first and second charge injecting layers comprising a light-emissive material for accepting and combining positive and negative charge carriers to generate light,
- wherein the light-emissive layer comprises a polymer according to claim 1 for accepting and combining positive and negative charge carriers or for transporting positive and/or negative charge carriers from the first and/or second charge injecting layer to the light-emissive material.

11. An optical device comprising a substrate and a polymer according to claim 4 supported on the substrate.

12. An electroluminescent device comprising:
- a first charge injecting layer for injecting positive charge carriers;
- a second charge injecting layer for injecting negative charge carriers;
- a light-emissive layer located between the first and second charge injecting layers comprising a light-emissive material for accepting and combining positive and negative charge carriers to generate light,
- wherein the light-emissive layer comprises a polymer according to claim 4 for accepting and combining positive and negative charge carriers or for transporting positive and/or negative charge carriers from the first and/or second charge injecting layer to the light-emissive material.

* * * * *

UNITED STATES PATENT AND TRADEMARK OFFICE
CERTIFICATE OF CORRECTION

| | | |
|---|---|---|
| PATENT NO. | : 7,898,163 B2 | Page 1 of 1 |
| APPLICATION NO. | : 11/585753 | |
| DATED | : March 1, 2011 | |
| INVENTOR(S) | : Richard O'Dell et al. | |

It is certified that error appears in the above-identified patent and that said Letters Patent is hereby corrected as shown below:

In the Specification:

At Column 1, line 21, "(electrons)s" should be -- (electrons) --.
At Column 1, line 26, "electrode" should be -- electrodes --.
At Column 16, line 17, "abase" should be -- a base --.

In the Claims:

At Column 32, line 32, "II" should be -- I --.

Signed and Sealed this
Fourteenth Day of February, 2012

David J. Kappos
*Director of the United States Patent and Trademark Office*